US007369076B1

(12) United States Patent
Chung et al.

(10) Patent No.: US 7,369,076 B1
(45) Date of Patent: May 6, 2008

(54) HIGH PRECISION DAC WITH THERMOMETER CODING

(75) Inventors: Shine Chung, Taipei Hsien (TW); Fu-Lung Hsueh, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/633,221

(22) Filed: Dec. 4, 2006

(51) Int. Cl.
*H03M 1/66* (2006.01)
(52) U.S. Cl. .................................. 341/144; 341/145
(58) Field of Classification Search ............... 341/144, 341/145
See application file for complete search history.

(56) References Cited

U.S. PATENT DOCUMENTS

| 6,163,283 | A  | * | 12/2000 | Schofield ............... 341/50 |
| 6,225,929 | B1 | * | 5/2001  | Beck ..................... 341/144 |
| 6,703,956 | B1 | * | 3/2004  | Mueller et al. .......... 341/145 |
| 6,778,118 | B2 | * | 8/2004  | Heizmann et al. ....... 341/144 |
| 7,030,799 | B2 | * | 4/2006  | Lee et al. ............... 341/144 |

OTHER PUBLICATIONS

J. Wikner and N. Tan, "Modeling of CMOS Digital-to-Analog Converters for Telecommunication," IEEE Transactions on Circuits and Systems II, vol. 46, No. 5, May 1999.

Van Der Plas, et al., "A 14-bit Intrinsic Accuracy Q2 Random Walk CMOS DAC," IEEE J. of Solid-State Circuits, vol. 34, No. 12, Dec. 1999, pp. 1708.

Jurgen Deveugele et al., "A Gradient-Error and Edge-Effect Tolerant Switching Scheme for a High-Accuracy DAC," IEEE Transactions on Circuits and Systems, vol. 51, No. 1, Jan. 2004, p. 191.

D. Wouter J. Groeneveld et al., "A Self-Calibration Techniques for monolithic High-Resolution D/A Converters," ISSCC89, p. 22.

Richard K. Hester et al., CODEC For Echo-Canceling, Full-Rate ADSL Modems, IEEE J. of Solid-Statue Circuits, vol. 34, No. 12, Dec., 1999.

* cited by examiner

*Primary Examiner*—Brian Young
(74) *Attorney, Agent, or Firm*—Kirkpatrick & Lockhart Preston Gates Ellis LLP

(57) ABSTRACT

A digital-to-analog converter comprising a digital input; a first thermometer coder for generating a set of first control signals based on a first portion of the digital input; at least one fractional-bit DAC cell controlled by one or more of the first control signals for providing a fractional-bit current based on the first portion of the digital input; at least one second thermometer coder for generating a set of second control signals based on a second portion of the digital input; and at least one multi-bit DAC cell controlled by one or more of the second control signals for providing a multi-bit current based on the second portion of the digital input, wherein the fractional-bit current and the multi-bit current are combined to form an output of the DAC corresponding to the digital input.

17 Claims, 5 Drawing Sheets

US 7,369,076 B1

HIGH PRECISION DAC WITH THERMOMETER CODING

BACKGROUND

The present invention relates generally to digital-to-analog converters and more particularly to a system and method for a high-precision digital-to-analog converter using thermometer coding and fractional-bit DAC.

Digital-to-analog conversion is a process for converting information from a digital signal into an analog signal such as a voltage or a current. The digital signal can usually be represented as a binary number. A binary number system represents numeric values using two symbols, typically 0 and 1. Binary numbers are characterized by their having different weighting for each digit (or bit), such that each bit represents an order of magnitude greater value. For a binary number, the weighting of the bit, often referred to as the significance of the bit, doubles for each digit. For example, bit 1 is twice the value of bit 0 and bit 2 is twice the value of bit 1.

In view of the foregoing, one means for converting a binary number to an analog signal is to couple the digital signal to a logic circuit that would, in turn, control multiple current sources. Each bit of the digital signal would control a current source to provide a current proportional to the weighting of the bit. For example, the least significant bit would control one unit of current, whereas the second least significant bit would control 2 units of current. The output of each of the current sources would be coupled to a resistive network such that a voltage corresponding to the digital input signal would be generated according to the weighting of the input bit patterns. This methodology is referred to as an "R-2R" DAC because resistance R and 2R are used to construct a telescope resistance network. The R-2R DAC has several limitations when put into practice. One of these limitations is the output impedance matching for the resistive network. Another limitation is that device mismatches make it difficult to achieve high precision with monotonicity. And a third limitation to the R-2R DAC is that there may be an increased in noise as the input signal changes to a more significant bit. For example, from "0111" to "1000". In this example, the noise is caused by turning off the current to bits 1, 2 and 3 while turning on the current to bit 4. Because of these limitations, binary coded DACs are often limited to 8 bit applications.

To overcome the limitations of the binary coded DAC described above, a "thermometer coder" may be used to convert a digital signal to an analog equivalent. Each bit of the thermometer coded signal would control a current source of equal weight, thus providing a current proportional to the fully decoded signals. Thermometer coders are used because the number of DAC cells are turned on proportional to the value of the input data. Thus, monotonicity can be ensured. This provides a lower noise analog output because there is less switching noise. The drawback to a thermometer coder is that they require a relatively large amount of area to implement on an integrated circuit. Therefore, to increase resolution, a combination of a thermometer coder combined and a conventional binary-coded DAC may be used to create a "segmented" DAC.

FIG. 1 shows a conventional segmented DAC 100. The segmented DAC 100 includes a binary input signal (b0-b9) coupled to latches 116. A first portion of the latches provides a signal that is coupled to the switches 118 and to a thermometer coder 114. The switches 118 are weighted to provide a current proportional to its respective bit (I0-I6). The thermometer coder also provides a signal to a second portion of the switches 118, which are weighted to provide substantially equal amounts of a current (I7-I13). The output of the switches 118 is coupled to a resistive network for providing a voltage (Vout) that is proportional to the binary input signal (b0-b9).

Higher level resolution may be achieved with this combined "segmented" method; however, it also requires a more sophisticated layout scheme, a relatively large integrated circuit area, and the output impedance needs to match the resistive network. Additionally, segmented DACS may also require trimming to correct for manufacturing variations and nonlinearity. For these reasons, it is desirable to have a digital-to-analog converter that uses less integrated circuit areas and provides a better quality analog output signal.

SUMMARY

The present disclosure provides for a digital-to-analog converter comprising a digital input; a first thermometer coder for generating a set of first control signals based on a first portion of the digital input; at least one fractional-bit DAC cell controlled by one or more of the first control signals for providing a fractional-bit current based on the first portion of the digital input; at least one second thermometer coder for generating a set of second control signals based on a second portion of the digital input; and at least one multi-bit DAC cell controlled by one or more of the second control signals for providing a multi-bit current based on the second portion of the digital input, wherein the fractional-bit current and the multi-bit current are combined to form an output of the DAC corresponding to the digital input.

The construction and method of operation of the invention, however, together with additional objectives and advantages thereof will be best understood from the following description of specific embodiments when read in connection with the accompanying drawings.

DESCRIPTION

Figure 1:
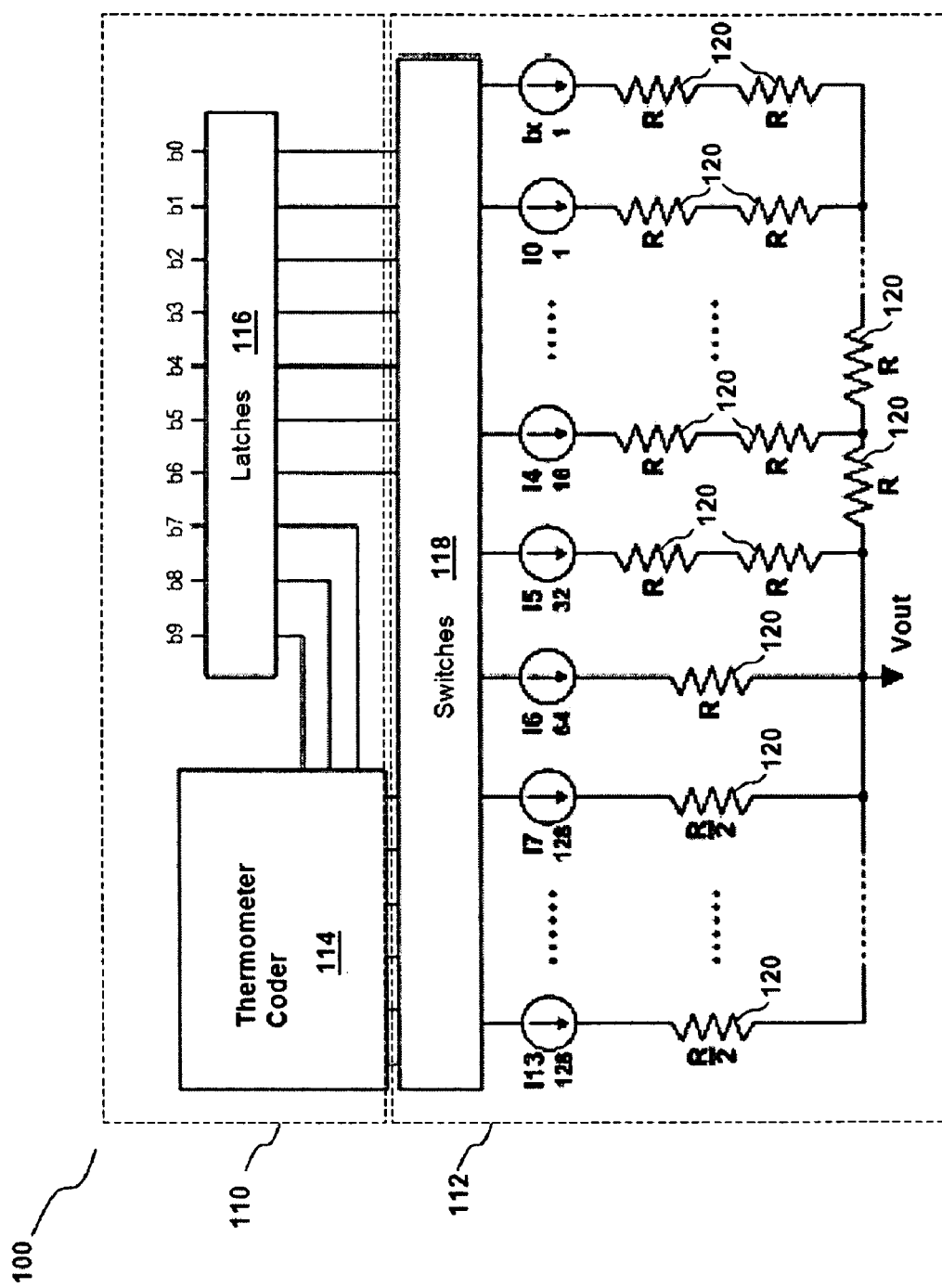
FIG. 1 illustrates a conventional segmented DAC.

Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Figure 2:
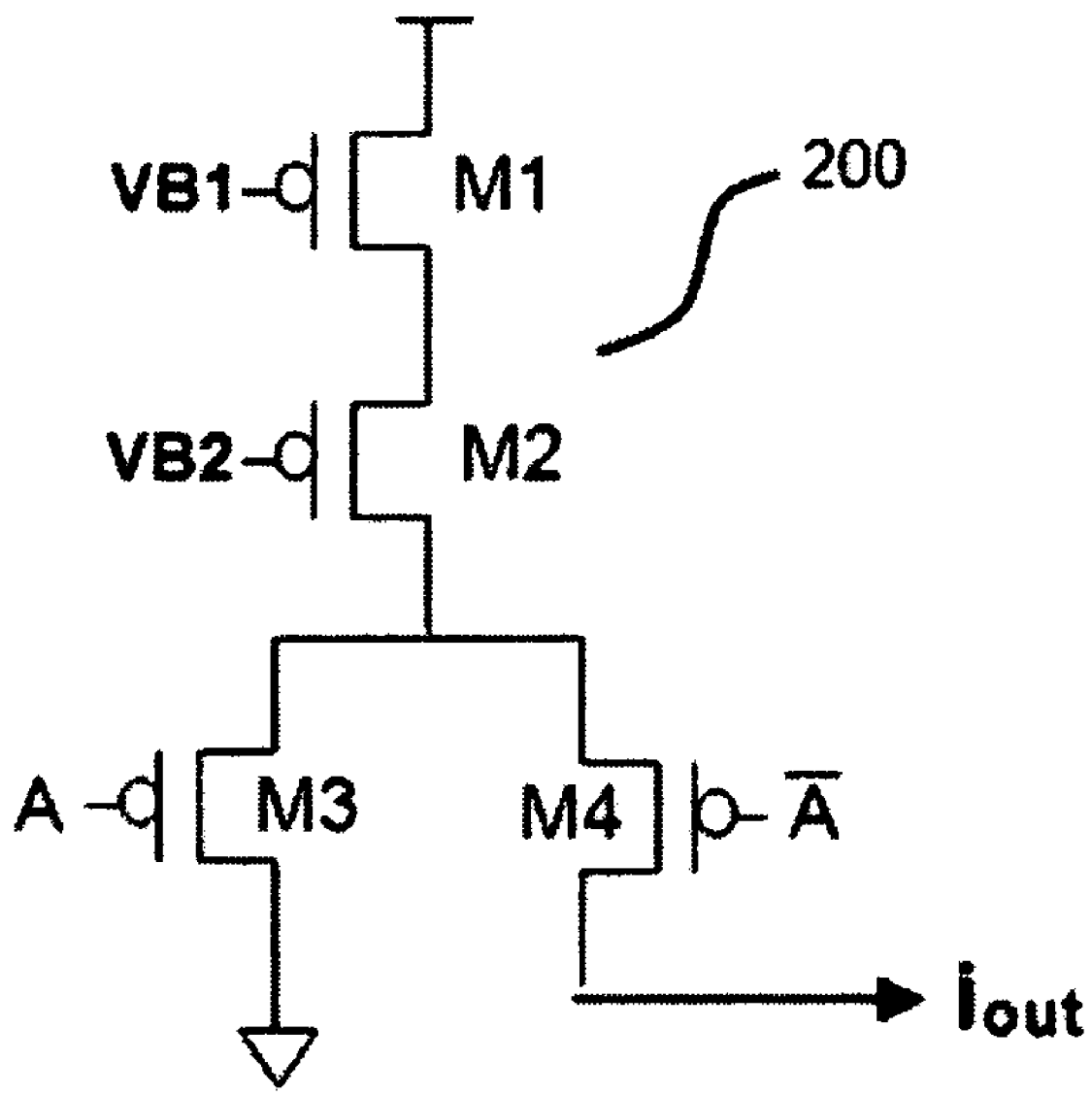
FIG. 2 illustrates a conventional current-steering DAC cell.

FIG. 2 shows a conventional current-steering type single-bit DAC cell 200. In this cell, transistors M1 and M2 are connected in series to increase the output impedance. The biasing voltages VB1 and VB2 are established so that M1 and M2 collectively act as a current source that, upon the appropriate control by VB1 and VB2, will provide a current to the cell. M3 and M4 act as steering transistors such that the current is supplied to either the output (Iout) or to a complementary supply voltage such as a ground (GND) or Vss according to the state of control signal A (and its complement). The control signal A may be generated externally by a digital input signal to be applied to the DAC cell. In practice, the output current from this cell would normally be directed to a resistive element to create a voltage.

Multi-bit DAC cells can be constructed to generate multiples of the amount of current of the single-bit DAC cell 200. For example, a two-bit (or dual-bit) DAC cell would provide twice the current of single-bit DAC cell and a sixteen-bit DAC cell would generate sixteen times the current of a single-bit DAC cell. In practice, current steering DAC cells may be controlled by thermometer coders.

One aspect of the current invention is the combination of fractional, single-bit and multi-bit DAC cells that provide for precise digital-to-analog conversion and provide the best trade-off between the number of semiconductor devices and the performance for a digital-to-analog conversion.

Figure 3:
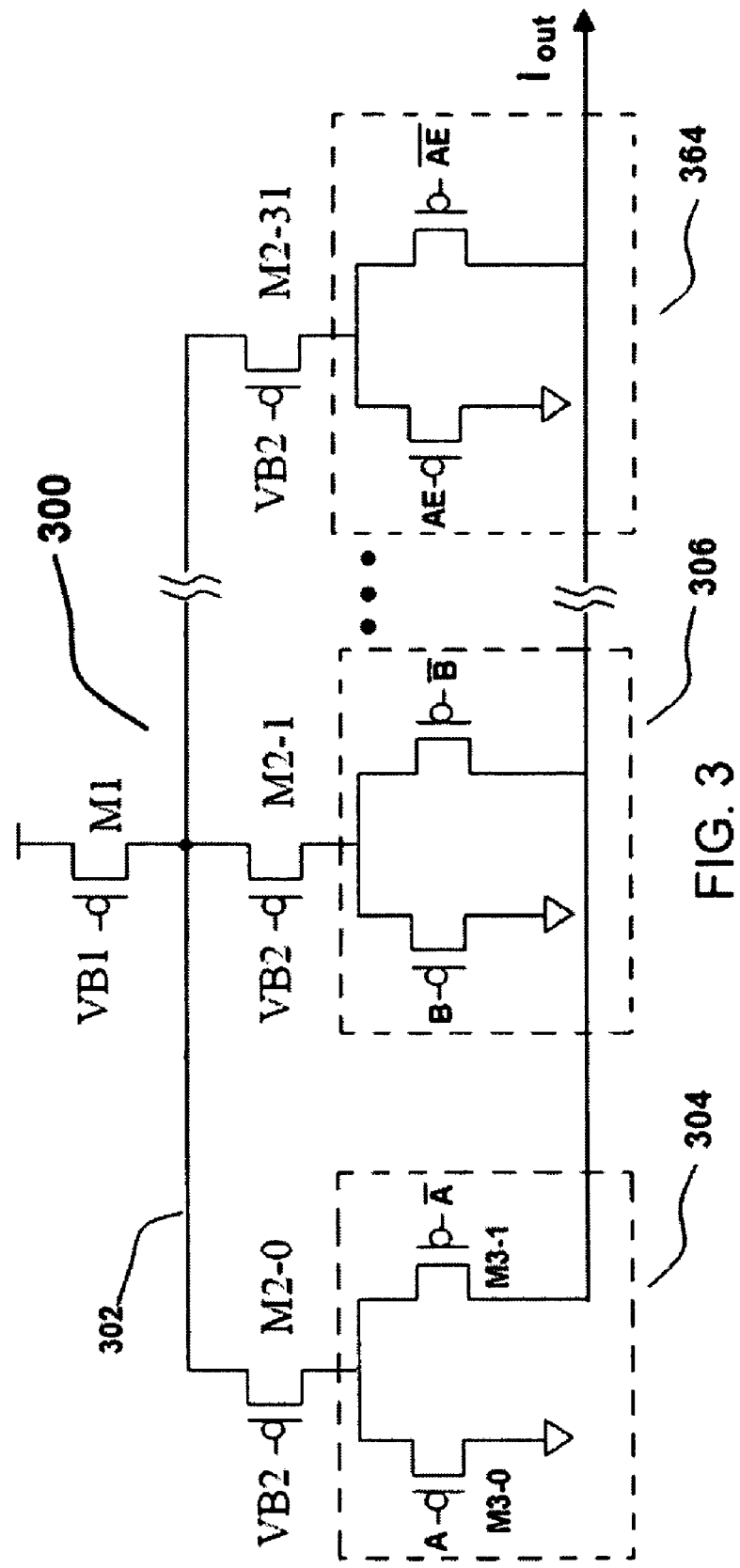
FIG. 3 illustrates a fractional-bit DAC cell according to one embodiment of the current invention.

FIG. 3 illustrates a fractional-bit DAC cell 300 according to one embodiment of the current invention. In this embodiment, current supplied by PMOS transistor M1 is divided into 32 branches with each branch having a control switch such as a PMOS transistor (M2-0 through M2-31) and each branch having a pair of steering transistors (M3-0 and M3-1). The controls of each pair of the steering transistors are connected to an output signal from a thermometer coder (A through AE).

To illustrate this embodiment, a five-bit digital signal is coupled to a thermometer coder. The thermometer coder outputs A through AE and their logical inverses that are supplied to control the steering transistor pairs 304 through 364. Each of the steering transistors pairs 304 to 364 switches $\frac{1}{32}^{nd}$ of the current supplied by M1 to the output $i_{out}$. For comparison, a single-bit DAC cell provides 100% of the current through M1, whereas a fractional-bit cell can provide fractions of a single-bit cell current proportional to the input value, based on the thermometer coding.

In this embodiment, each steering transistor controls substantially equal amounts of the current and thus must be similarly constructed. It will be apparent to one having skill in the art that the interconnect between M1 and M2-0 through M2-31 must be constructed to provide equal amounts of the current to each of M2-0 through M2-31 and that the metal line (302) needs to be a very low impedance. According to one embodiment, the width of metal line 302 should be at least 3 times the gate lengths of the MOS devices M2-0 through M2-31. The transistors M2-0 through M2-31 may be physically located to optimize the length of portions of the metal line 302 so that the impedance of the metal line 302 does not unbalance the current distribution among the transistors M2-0 through M2-31.

It will also be appreciated by one having skill in the art that the routing of all of the interconnects between layers on integrated circuits must provide low impedance, low contact resistance and balanced current. Multiple interconnects can be used to reduce losses and provide equal distribution of the current to each of M2-0 through M2-31.

It would also be within the spirit of the current invention to use different combinations of transistors to be combined to provide higher, lower or mixed resolution output current $i_{out}$. For example, among other possible combinations, a four-bit thermometer coder could be used to provide fractional conversion of $\frac{1}{16}^{th}$ of the current or different bits could be constructed to provide for differing fractional amounts of the current such that one bit provides a certain portion and another bit provides a different portion of the current. Combinations could be constructed to provide non-linear analog-to-digital conversion and different output impedances.

Figure 4:
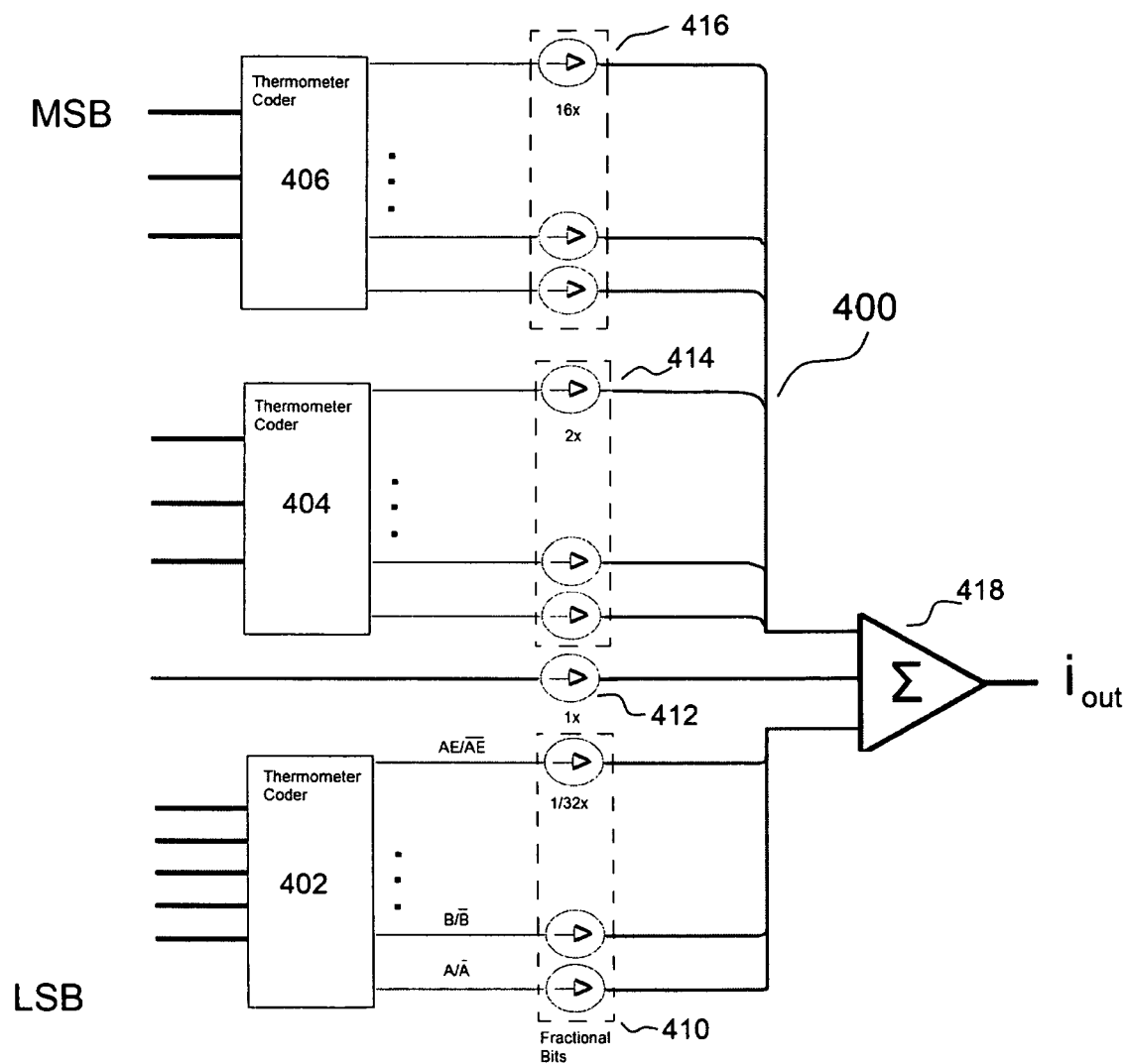
FIG. 4 illustrates an embodiment of the current invention in a 12-bit DAC.

FIG. 4 shows an embodiment of the current invention in a digital-to-analog converter 400. A 12-bit signal is coupled to the DAC such that the least significant bits (0 through 4) are coupled to a first thermometer coder 402 to generate fractions of a single-cell current. Bit 5 is coupled to a single-bit DAC cell 412 such that the single bit DAC cell is controlled by bit 5 and its logical inverse (not shown). Bits 6, 7 and 8 are coupled to a second thermometer coder 404. And bits 9, 10 and 11 are coupled to a third thermometer coder 406. The outputs of the first thermometer coder 402 and their logical inverses are connected to a fractional-bit DAC cell 410. The outputs of the second thermometer coder 404 and their logical inverses are connected to a series of dual-bit DAC cells. The outputs of the third thermometer coder 406 and their logical inverses are connected to a series of sixteen-bit weighted DAC cells. The outputs of all the DAC cells 410, 412, 414 and 416 are connected to a summing junction 418 such that the output current $i_{out}$ is proportional to the sum of the output current from each DAC cell 410, 412, 414 and 416.

Figure 5:
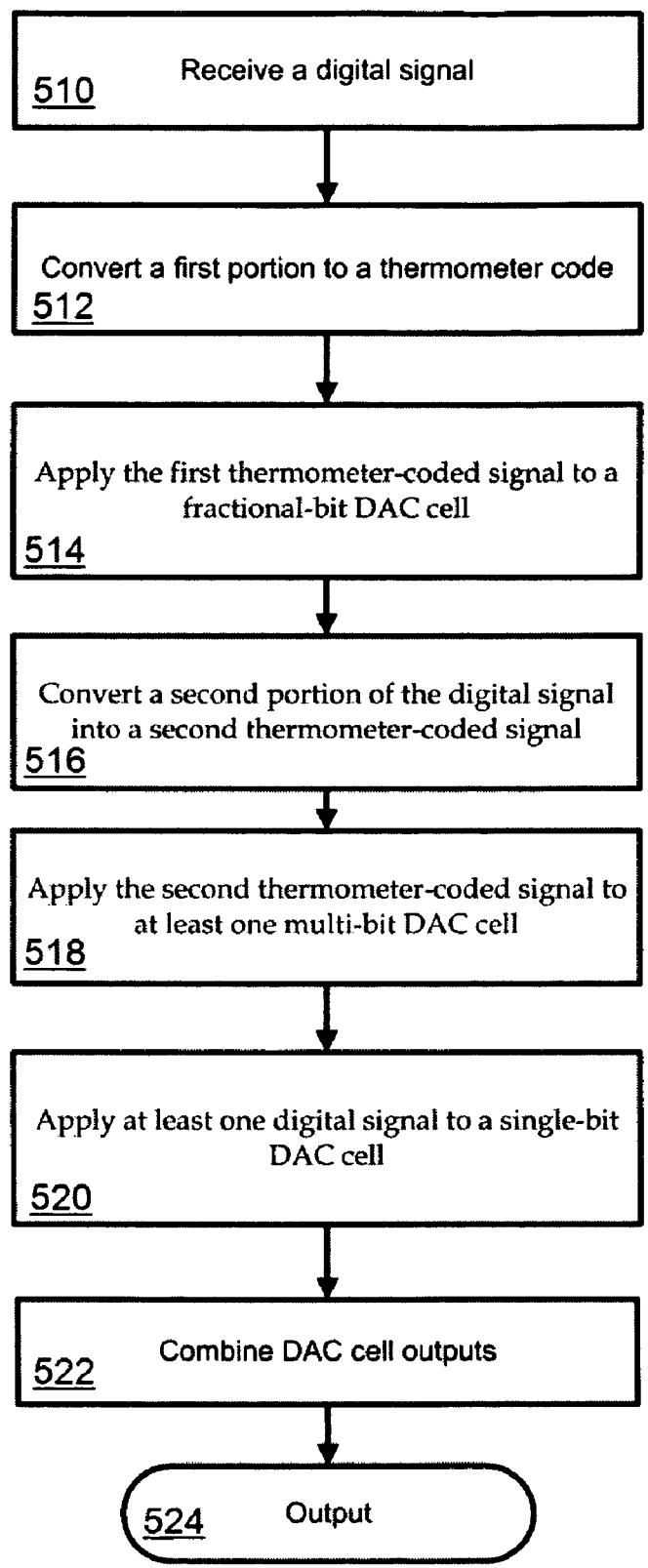
FIG. 5 is a flowchart illustrating one method of operating an embodiment of the current invention.

FIG. 5 illustrates steps in using the invention in view of the foregoing. The current embodiment operates by receiving a digital signal (510), converting a portion (segment) of the digital signal into a thermometer coded signal (512) to be applied to a fractional-bit DAC cell (514), wherein the fractional-bit DAC cell provides an output current corresponding to the digital signal (524). The figure also discloses segmenting the digital signal into additional portions, converting each additional portion into thermometer coded signals to be applied to at least one multi-bit DAC cell such that the fractional-bit DAC cell and the multi-bit DAC cell provide the output current (steps 516-522). A person skilled in the art would appreciate that the steps in FIG. 5 need not all be implemented to practice the current invention.

It will also be appreciated by one having skill in the art that this embodiment eliminates the need for R2R ladders and uses considerably less DAC cells than conventional thermometer code designs using single-bit cells. Since these elements typically require more area and current when implemented monolithically, this embodiment may realize precise digital-to-analog conversion using less area and current than conventional analog-to-digital converters. It will also be appreciated by one having skill in the art that this invention can be used in other embodiments having different digital signals than the one shown.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A digital-to-analog converter comprising:
   a digital input;

a first thermometer coder for generating a set of first control signals based on a first portion of the digital input;
at least one fractional-bit DAC cell controlled by one or more of the first control signals for providing a fractional-bit current based on the first portion of the digital input;
at least one second thermometer coder for generating a set of second control signals based on a second portion of the digital input; and
at least one multi-bit DAC cell controlled by one or more of the second control signals for providing a multi-bit current based on the second portion of the digital input,
wherein the fractional-bit current and the multi-bit current are combined to form an output of the DAC corresponding to the digital input.

2. The converter of claim 1 further comprising:
a single-bit DAC cell providing a single-bit current based on a third portion of the digital input,
wherein the fractional-bit current, the single-bit current and the multi-bit current are combined to form an output of the DAC corresponding to the digital input.

3. The converter of claim 1, wherein the first portion of the digital input is selected from the least significant bits of the digital input and the second portion of the digital input is selected from the most significant bits of the digital input.

4. The converter of claim 1, wherein the fractional-bit DAC cell comprises:
a first PMOS device whose source is connected to a power supply and whose gate is connected to a first bias voltage;
a plurality of second PMOS devices, each of said second PMOS devices having a source connected to a drain of the first PMOS device and a gate connected to a second bias voltage;
a plurality of first steering PMOS devices, each of said first steering PMOS devices having a source connected to a drain of one of the second PMOS devices, a drain connected to a complementary supply, and a gate connected to one of the control signals; and
a plurality of second steering PMOS devices, each of said second steering PMOS devices having a source connected to a drain of one of the second PMOS devices, a gate connected to a logical inverse of one of the control signals and a drain for providing a portion of the output of the fractional-bit DAC cell,
wherein the drains of the plurality of second steering PMOS devices are connected together to provide the fractional-bit current.

5. The converter of claim 4, wherein the second steering PMOS devices each provide substantially equal fractional amounts of current whereby the output current is substantially linear with respect to the digital input.

6. The converter of claim 4, wherein the second steering PMOS devices each provide different fractional amounts of current whereby the output current is nonlinear with respect to the digital input.

7. The converter of claim 4, wherein each of the second PMOS devices is connected to the drain of the first PMOS device with a metal line, the metal line having a width at least 3 times a gate length of the second PMOS device.

8. The converter of claim 4, wherein each of the second PMOS devices are disposed monolithically to optimize a current distribution among the second PMOS devices wherein the distance between each of the second PMOS devices is substantially equal so that the transmission losses of an electrical current from the drain of the first PMOS device to the source of each of the second PMOS devices is substantially equal.

9. A digital-to-analog converter comprising:
a digital input;
a first thermometer coder for generating a set of first control signals based on a first portion of the digital input, said first portion selected from the least significant bits of the digital input;
at least one fractional-bit DAC cell controlled by one or more of the first control signals for providing a fractional-bit current based on the first portion of the digital input;
at least one second thermometer coder for generating a set of second control signals based on a second portion of the digital input said second portion selected from the most significant bits of the digital input;
at least one multi-bit DAC cell controlled by one or more of the second control signals for providing a multi-bit current based on the second portion of the digital input; and
a single-bit DAC cell providing a single-bit current based on a third portion of the digital input,
wherein the fractional-bit current, the single-bit current and the multi-bit current are combined to form an output of the DAC corresponding to the digital input.

10. The converter of claim 9, wherein the fractional-bit DAC cell comprises:
a first PMOS device whose source is connected to a power supply and whose gate is connected to a first bias voltage;
a plurality of second PMOS devices, each of said second PMOS devices having a source connected to a drain of the first PMOS device and a gate connected to a second bias voltage;
a plurality of first steering PMOS devices, each of said first steering PMOS devices having a source connected to a drain of one of the second PMOS devices, a drain connected to a complementary supply, and a gate connected to one of the control signals; and
a plurality of second steering PMOS devices, each of said second steering PMOS devices having a source connected to a drain of one of the second PMOS devices, a gate connected to a logical inverse of one of the control signals and a drain for providing a portion of the output of the fractional-bit DAC cells,
wherein the drains of the plurality of second steering PMOS devices are connected together to provide the fractional-bit current.

11. The converter of claim 10 wherein each of the second steering PMOS devices provides substantially equal fractional amounts of the fractional-bit current such that the fractional-bit current is substantially linear with respect to the digital input.

12. The converter of claim 10, wherein each of the second steering PMOS devices provides unequal fractional amounts of the fractional-bit current such that the fractional-bit current is substantially nonlinear with respect to the digital input.

13. The converter of claim 10, wherein each of the second PMOS devices is connected to the drain of the first PMOS device with a metal line, the metal line having a width at least 3 times a gate length of the second PMOS device.

14. The converter of claim 10, wherein each of the second PMOS devices are disposed monolithically to optimize a current distribution among the second PMOS devices wherein the distance between each of the second PMOS devices is substantially equal so that the transmission losses of an electrical current from the drain of the first PMOS device to the source of each of the second PMOS devices is substantially equal.

15. A method of converting a digital signal into an analog signal comprising:
   receiving a digital signal;
   converting a first portion of the digital signal into a first thermometer-coded signal;
   applying the first thermometer-coded signal to a fractional-bit DAC cell, wherein the fractional-bit DAC cell provides a fractional-bit current corresponding to the digital signal;
   converting a second portion of the digital signal into a second thermometer-coded signal; and
   applying the second thermometer-coded signal to at least one multi-bit DAC cell for providing a multi-bit current, wherein the fractional-bit current and the multi-bit current are combined to provide the analog signal.

16. The method of claim 15, further comprising applying at least one digital signal to a single-bit DAC cell for providing a single-bit current, wherein the fractional-bit current, the single-bit current and multi-bit current are combined to provide the analog signal.

17. The method of claim 15 wherein the fractional-bit DAC cell comprises:

a first PMOS device whose source is connected to a power supply and whose gate is connected to a first bias voltage;
   a plurality of second PMOS devices, each of said second PMOS devices having a source connected to a drain of the first PMOS device and a gate connected to a second bias voltage;
   a plurality of first steering PMOS devices, each of said first steering PMOS devices having a source connected to a drain of one of the second PMOS devices, a drain connected to a complementary supply, and a gate connected to one of the control signals; and
   a plurality of second steering PMOS devices, each of said second steering PMOS devices having a source connected to a drain of one of the second PMOS devices, a gate connected to a logical inverse of one of the control signals and a drain for providing a portion of the output of the fractional-bit DAC cell,
wherein the drains of the plurality of second steering PMOS devices are connected together to provide the fractional-bit current.

* * * * *